(12) United States Patent
Heubel et al.

(10) Patent No.: US 7,020,292 B1
(45) Date of Patent: Mar. 28, 2006

(54) APPARATUSES AND METHODS FOR RECOGNIZING AN AUDIO INPUT AND MUTING AN AUDIO DEVICE

(75) Inventors: Michael L. Heubel, Marietta, GA (US); Andrew W. Clegg, Roswell, GA (US)

(73) Assignee: BellSouth Intellectual Property Corporation, Wilmington, DE (US)

( * ) Notice: Subject to any disclaimer, the term of this patent is extended or adjusted under 35 U.S.C. 154(b) by 495 days.

(21) Appl. No.: 10/032,918

(22) Filed: Dec. 27, 2001

(51) Int. Cl.
*H04B 15/00* (2006.01)
*H04R 29/00* (2006.01)
*H04M 11/00* (2006.01)

(52) U.S. Cl. ............... 381/94.5; 381/94.1; 381/56; 381/58; 379/93.29

(58) Field of Classification Search ............ 381/77, 381/81, 86, 94.1, 94.5, 56–58, 123, 107, 381/111; 700/94; 455/556.1, 66.1, 569.2, 455/575.9, 174.1, 177.1, 212, 211, 218, 221, 455/425, 500
See application file for complete search history.

(56) References Cited

U.S. PATENT DOCUMENTS

| | | | | |
|---|---|---|---|---|
| 4,837,558 A | 6/1989 | Abel et al. | ............ | 340/550 |
| 5,404,391 A | 4/1995 | Wavroch et al. | ............ | 379/59 |
| 5,420,907 A * | 5/1995 | Shapiro | ............ | 379/38 |
| 5,651,056 A | 7/1997 | Eting et al. | ............ | 379/88 |
| 5,678,200 A | 10/1997 | Levi | ............ | 455/88 |
| 5,764,852 A | 6/1998 | Williams | ............ | 395/2.52 |
| 5,777,571 A * | 7/1998 | Chuang | ............ | 341/176 |
| 5,864,807 A | 1/1999 | Campbell et al. | ............ | 704/244 |
| 6,476,878 B1 * | 11/2002 | Lafay et al. | ............ | 348/738 |
| 6,584,201 B1 * | 6/2003 | Konstantinou et al. | ............ | 381/57 |
| 2002/0137505 A1 * | 9/2002 | Eiche et al. | ............ | 455/425 |

FOREIGN PATENT DOCUMENTS

EP       0 702 351 B1     10/2001
JP       2000278628 A  *  10/2000

OTHER PUBLICATIONS

Pioneer sound.vision.soul, Cellular Mute, http:/www.pioneer-racing.com/Pione.../0,1484,40-4010-40101500-1486,00.html?self-tru.
Pioneer sound.vision.soul, Cellular Phone Hands Free Kit 'Hands-Free', http:/www.pioneer-racing.com/Pione.../0,1484,40-4010-40101500-1317,00.html?self-tru.
Cell Phone Accessories, Are You Ready to Order?. http://www.expomed.com/consumer/safety/cellphone.htm.

* cited by examiner

*Primary Examiner*—Laura A. Grier
(74) *Attorney, Agent, or Firm*—Lee & Hayes, PLLC

(57) ABSTRACT

An apparatus and method for generating a muting signal. The apparatus includes an audio signal detector for remotely receiving an audio signal and a processor in communication with the detector. The processor is configured to compare the received audio signal with a predetermined audio signal generated by a device and generate a muting signal when at least a component of the received audio signal matches the predetermined audio signal.

12 Claims, 6 Drawing Sheets

APPARATUSES AND METHODS FOR RECOGNIZING AN AUDIO INPUT AND MUTING AN AUDIO DEVICE

BACKGROUND OF THE INVENTION

1. Field of the Invention

The invention relates to apparatuses and methods for muting an audio device upon the recognition of an audio input generated by another device.

2. Description of the Invention Background

The ring of a telephone, be it cordless, wired or cellular, invariably demands attention, and especially in situations when a call is expected, such as a business call in an office, an important call in a cell phone while driving, a family call while lying in a hospital bed, and so on. In many of these situations, a person may be listening to a program on the radio, a CD on a CD player, or watching television, or simply having a background sound from an audio device, when a telephone rings. It is often not convenient to reduce such "background" sound before the telephone is answered. When driving, in particular, muting the radio to answer a cell phone call, even when using a hands-free cell phone kit, may still be dangerous.

U.S. Pat. No. 5,404,391 discloses an incoming call alert system for cellular telephones without wired connection thereto. The alert system includes a transducer tuned to receive the voice channel frequency.

U.S. Pat. No. 5,678,200 discloses a device for controlling an accessory based on the detection of transmissions of appropriate input frequency exceeding a minimum threshold amplitude from a nearby cellular telephone.

SUMMARY

One embodiment of the invention provides an apparatus for generating a muting signal. The apparatus includes an audio signal detector for remotely receiving an audio signal and a processor in communication with the detector. The processor is configured to compare the received audio signal with a predetermined audio signal generated by a device, and generate a muting signal when at least a component of the received audio signal matches the predetermined audio signal.

BRIEF DESCRIPTION OF THE DRAWINGS

In the accompanying Figures, there are shown present embodiments of the invention wherein like reference numerals are employed to designate like parts and wherein.

DETAILED DESCRIPTION OF THE INVENTION

Figure 1:
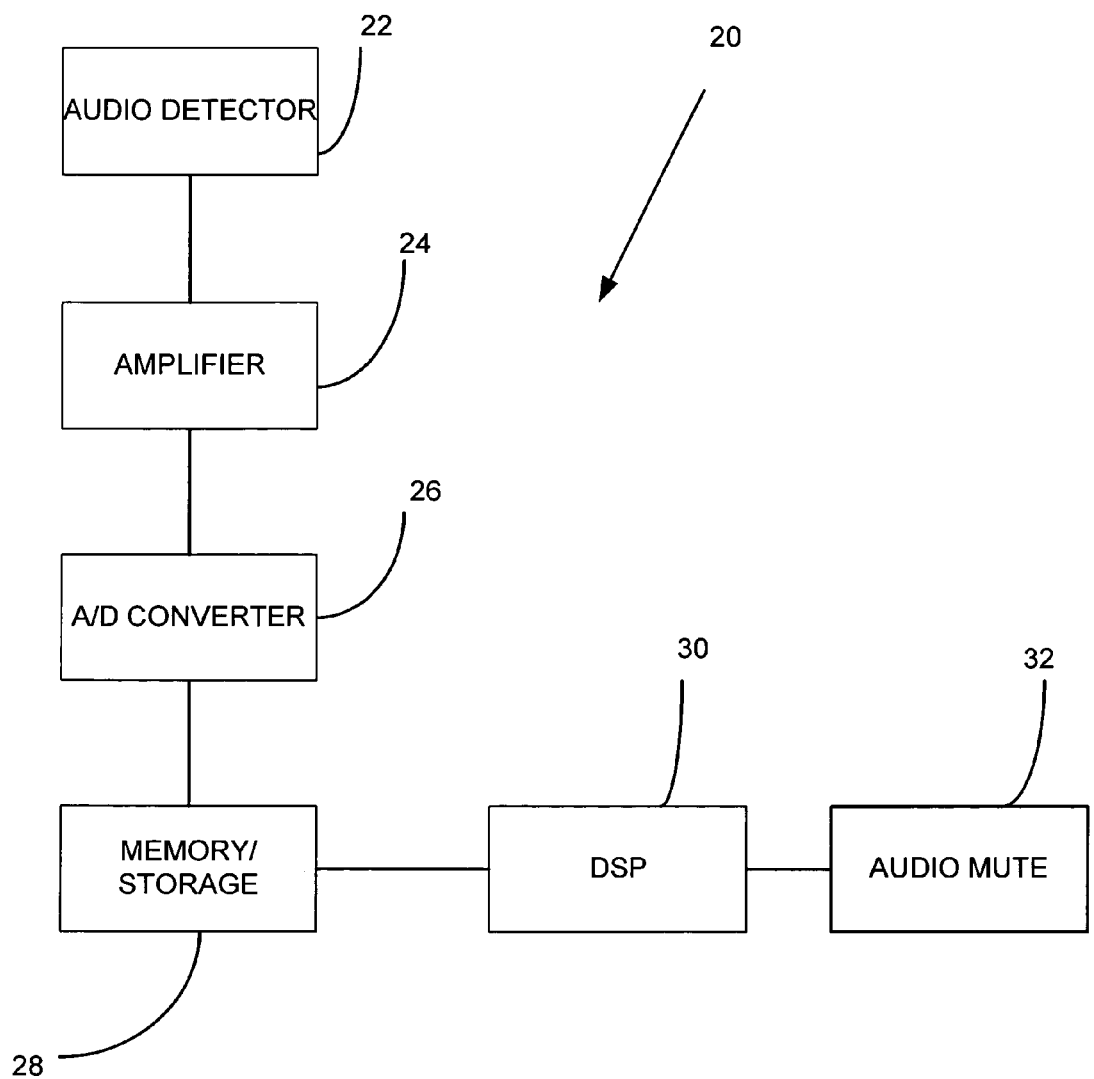
FIG. 1 is a block diagram of an embodiment of the apparatus of the present invention.

Referring now to the drawings for the purpose of illustrating the invention and not for the purpose of limiting the same, it is to be understood that standard components or features that are within the purview of an artisan of ordinary skill and do not contribute to the understanding of the various embodiments of the invention are omitted from the drawings to enhance clarity.

FIG. 1 is a block diagram of an embodiment of an audio input recognizer and muter 20, hereinafter "recognizer 20", according to the present invention. A ring is the audible alert from a telephone or similar device 80 (shown in FIG. 4) indicating that a telephone call signal is being received. The telephone device 80 may be a wireless terminal, i.e. cell phone, a cordless phone, a wired telephone apparatus, etc. However, the present invention is not limited to recognizing the ring of a telephone, but may also be configured to recognize other types of audible signals.

The recognizer 20 includes an audio detector 22, such as a transducer or a microphone that receives an audio input. The recognizer 20 may also include an amplifier 24 that is connected to the detector 22, for amplifying a detected audio signal from the detector 22. The detected audio signal may then be transmitted to an analog/digital (A/D) converter 26 that digitizes the detected audio signal. The digitized detected audio signal may then be saved in a memory or storage device 28, including an audio recording device, such as a CD, an audiocassette, hard disk or a logic block. The audio input may be a ring audio input from a telephone device 80. The memory/storage device 28 may include digitized ring audio signals that are stored either during a training session or stored by the manufacturer of the recognizer 20.

The recognizer 20 may also include a digital signal processor (DSP) 30. The DSP 30 includes instructions for processing digital audio signals. The DSP 30 may include additional instructions and memory to increase the processing rate. Accordingly, the storage device 28 may be integral with or separate from the DSP 30. The DSP 30 may be any type of suitable processor such as, for example, a microprocessor or a DSP integrated circuit chip or system.

The DSP 30 is operable to process digital audio signals. For example, in one embodiment, the DSP 30 compares a digitized detected audio signal to one or more pre-stored digitized ring audio signals that reside in the memory/storage device 28. Processing, which may be continuous, may include, for example, filtering out environmental noise, performing correlations, transforms, or other mathematic functions for enhancing sensitivity to the pre-stored audio signal, extracting ring parameters for each ring audio input and creating a digital signature for a ring audio input. Processing may include any methods and associated circuitry that are known in digital signal processing, audio discriminator technologies and speech recognition, including speech recognition using neural network processing. An electronic audio discriminator for detecting breaking glass is, for example, described in U.S. Pat. No. 4,837,558, which is herein incorporated by reference in its entirety. A method and apparatus for training a system to assess the identity of a person through the audio characteristics of their voice applying neural network type processing is, for example, disclosed in U.S. Pat. No. 5,864,807, which is herein incorporated by reference in its entirety.

The DSP 30 may include software instructions or firmware to perform the functions described herein. Such software instructions may be implemented in any suitable computer language.

Figure 4:
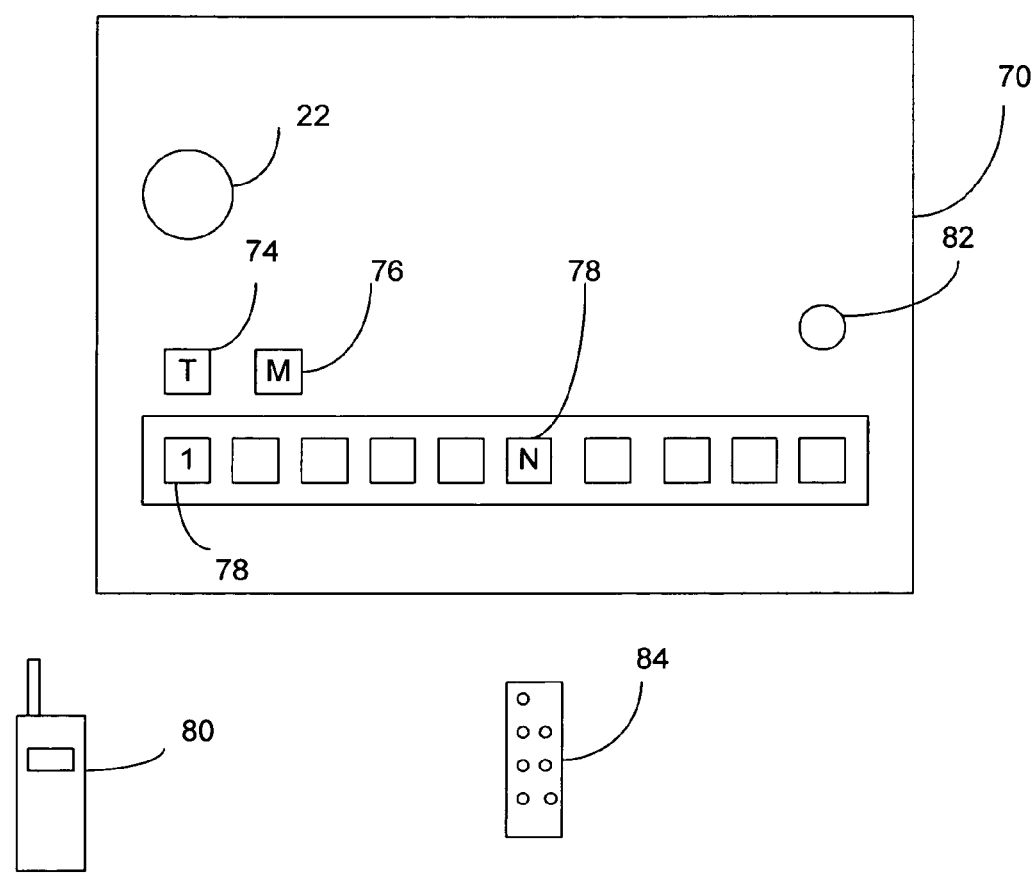
FIG. 4 is a schematic diagram of an embodiment of an audio device according to present invention, shown in the proximity of a telephone.
Figure 5:
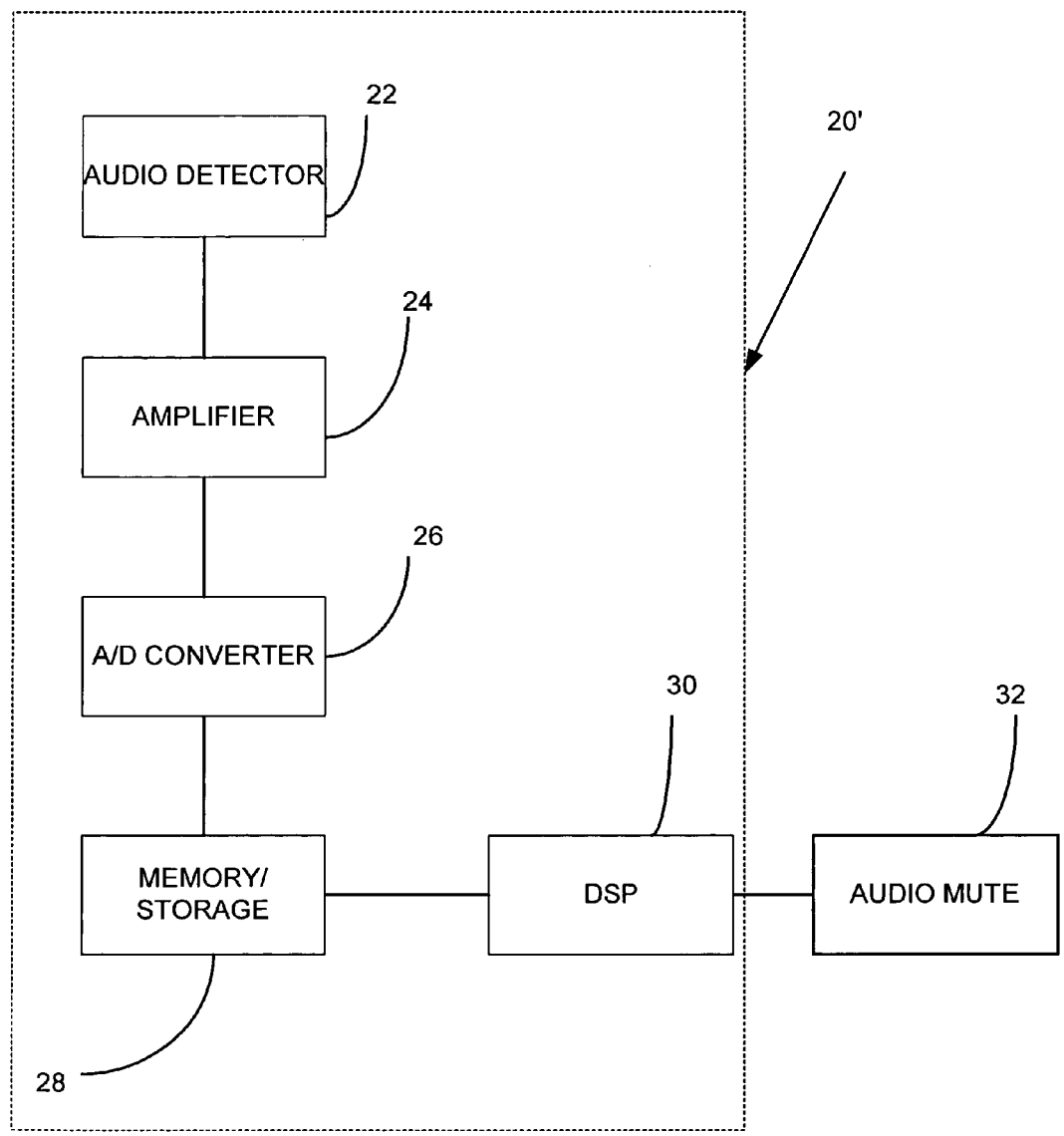
FIG. 5 is a block diagram of another embodiment of the apparatus of the present invention.
Figure 6:
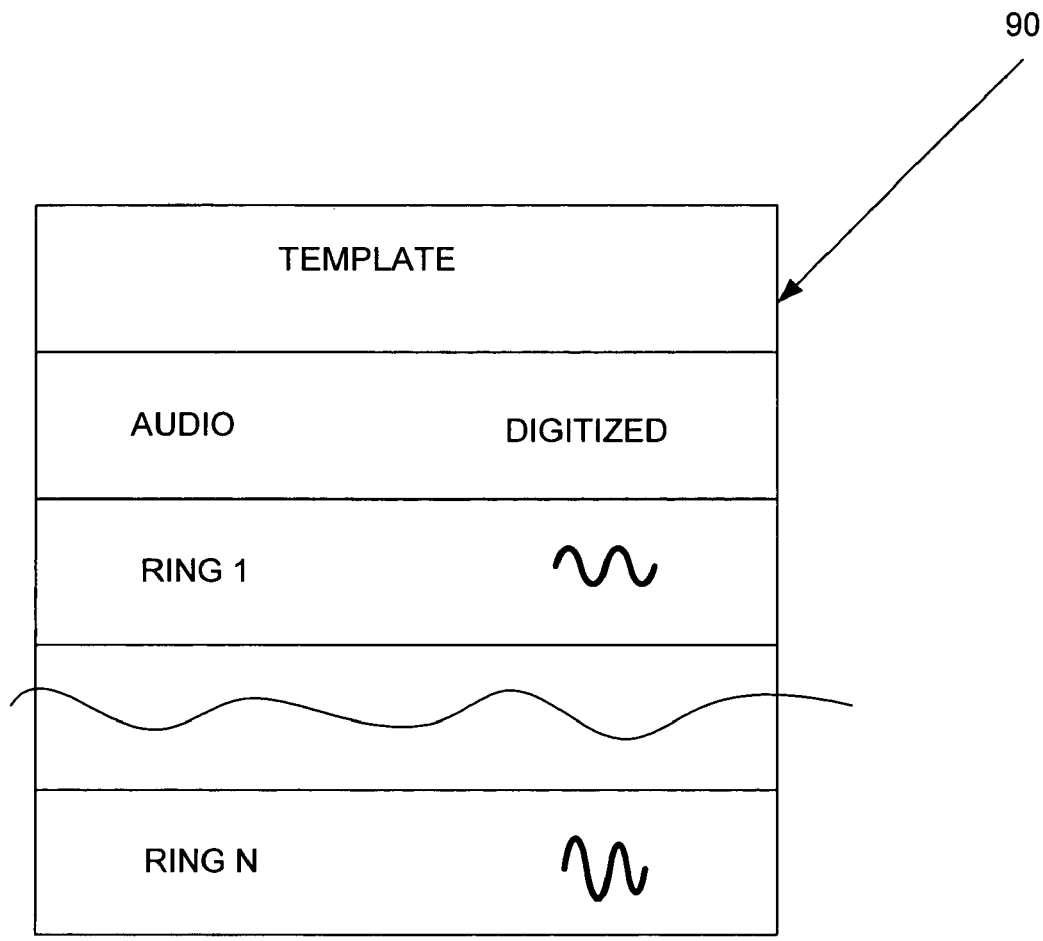
FIG. 6 is an exemplary diagram of a template according to an embodiment of the present invention.

The DSP 30 recognizes an audio input as a ring audio input when the comparison between the digitized detected audio signal and a pre-stored digitized ring audio signal determines that the digitized audio signal contains a component that matches the pre-stored signal. In the event of a match, the DSP 30 transmits a muting signal to the mute circuitry 32 of an audio device 70, shown in FIG. 4. The audio device 70 may be a car radio, a stereo system, a television, a CD player, a DVD player, or any such device that produces sound for listening and operates in the vicinity of the telephone 80. The recognizer 20 may be integrally incorporated inside the audio device 70, or it may be external to the audio device 70, as shown in FIG. 5, in which case it may be connected to the audio device mute 32 through a jack 82 on the audio device 70. The reference number 20' is used hereinafter to indicate the recognizer 20 embodiment of FIG. 5.

Figure 2:
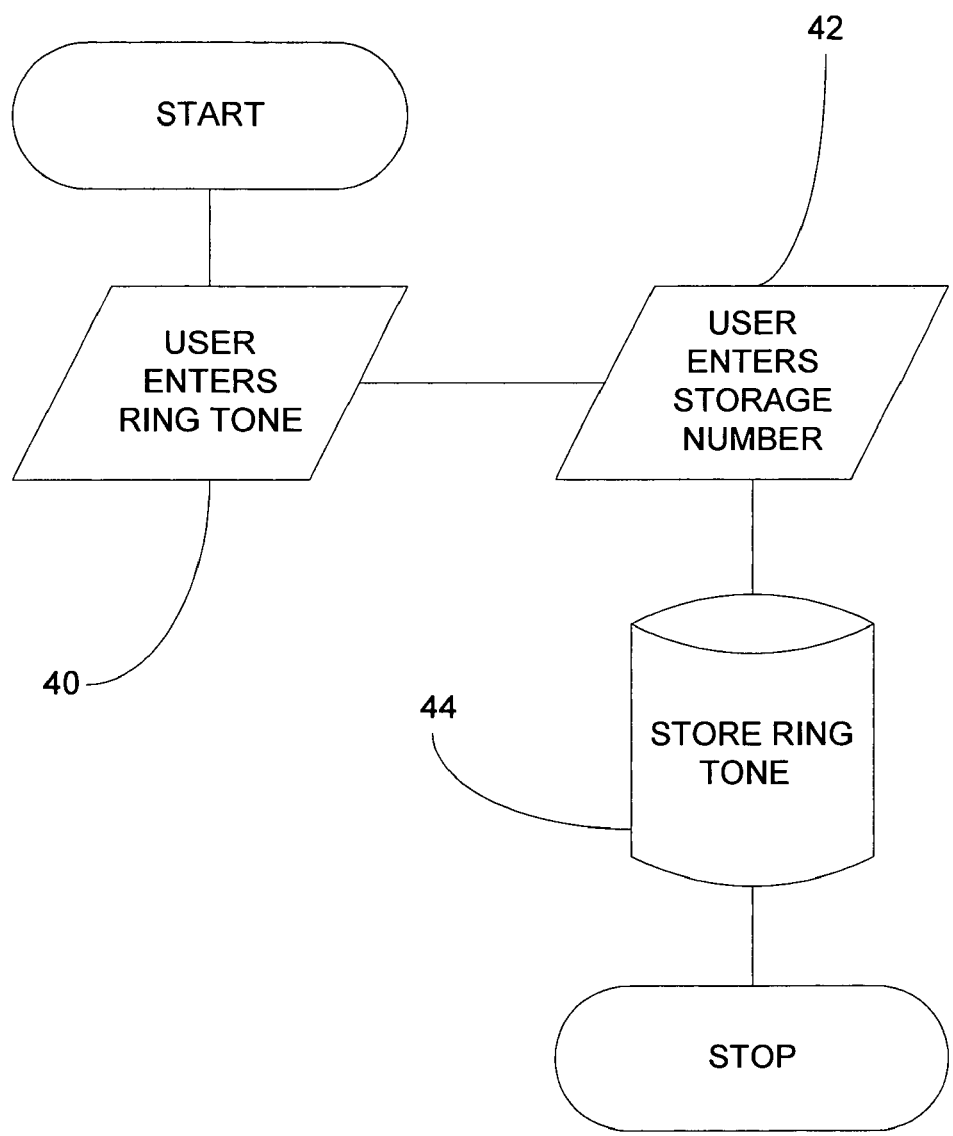
FIG. 2 is an exemplary flowchart of one embodiment of a training session for the apparatus of FIG. 1.

The recognizer 20 includes in the memory/storage device 28 a template 90 with N entries of digitized ring audio signals representing various ring tones, where N is an integer equal to or greater than 1. Some of the entries, for example in the range 1 to $N_1$ may be reserved and pre-programmed by the manufacturer into the template 90 of the recognizer 20. Such entries may correspond to the most common ring tones for various brands of cell phones and wireless terminals, for example. Additionally, new entries, for example in the range $(N_1+ 1)$ to N may be stored in the recognizer 20 by the user, as illustrated in the flowchart of FIG. 2, during a training session.

At the start of a training session, the recognizer 20 is put in a ready mode to receive audio input. At action 40 the user causes the telephone 80 to ring in the proximity of the audio detector 22, such as in an otherwise quiet environment to minimize ambient noise. At action 42, the user may enter a storage number, for example a number in the range $(N_1+1)$ to N, to label the particular telephone ring and store it in an appropriate entry in the template 90 at action 44.

The training procedure is now described in connection with the audio device 70 shown in FIG. 4. A training session is initiated by selecting a training mode to prepare the recognizer 20 to receive audio input and enter such input in digitized form into the template 90. The training mode is selected, for example, by setting a training mode on/off switch 74 to the "on" position. The telephone 80 is made to ring in the vicinity of the detector 22. A storage key 78, such as, for example, a conventional push/pull radio key, or other conventional on/off button may be manipulated to assign a storage or labeling number to the entry. The storage operation may also be accomplished through a remote control unit 84 for the audio device 70, and may include recording the audio input.

Figure 3:
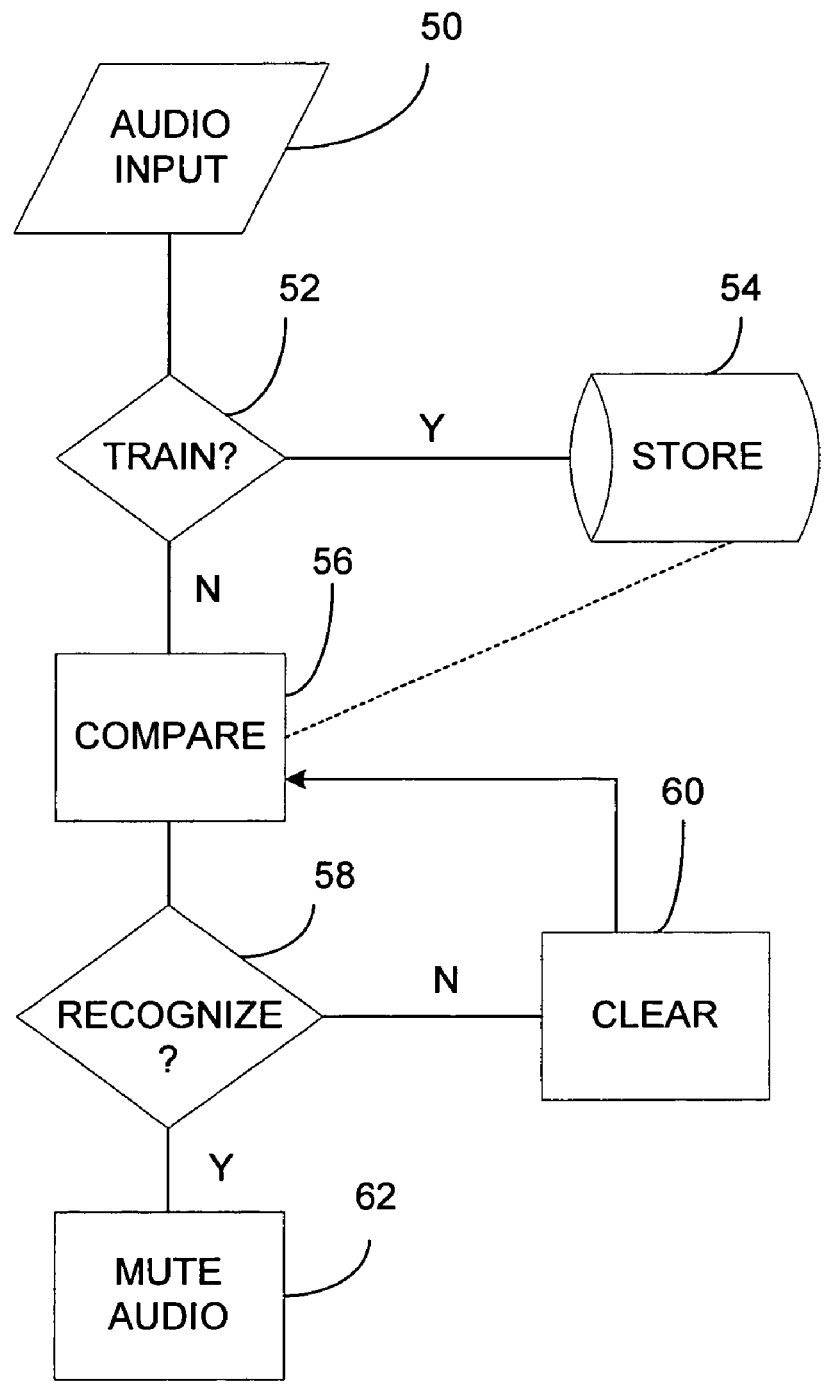
FIG. 3 is an exemplary flowchart which depicts one embodiment of the operation of the apparatus of FIG. 1.

The flowchart of FIG. 3 illustrates one method of operating the recognizer 20. The operation is commenced with receipt of an audio input (action 50). A decision is then made to determine whether the detected audio signal is for the purpose of training or not based on the position of the training mode switch 74 (action 52). If the training mode switch 74 is "on", the detected audio signal is processed for storage in the template 90 (action 54). If the training mode switch is "off", the detected audio signal may be continuously processed for recognition by comparing its digitized form with the entries in the template 90 (action 56). A recognition decision is then made (action 58). If no match is found in the template 90, then the digitized audio signal is cleared (action 60) and the sampling process begins again. If a match is found, the DSP 30 generates and transmits a signal to mute the audio device 70 (action 62). After the telephone conversation is over, the audio device can be returned to the un-muted position by operating manually, or through the remote control unit 84, a muting on/off switch 76, or automatically if the recognizer 20 is trained to recognize that a particular conversation is over or the phone is returned to an "on hook" position, by an audible voice command from the user, for example.

When the recognizer 20 is used in connection with a car radio or a car CD player, a driver or passenger in the car will not have to manually mute the radio in the event a cell phone rings in the car.

The recognizer 20 also may be used in connection with audio devices such as, for example, a television, a stereo system, a radio, a CD player, etc. in other environments, such as, for example, in an office room or cubicle or in a private room in a hospital. A person working in the office or a patient or visitor in the hospital room can answer the telephone without having to first mute or turn off the audio device either manually or by operating a remote control unit.

Whereas particular embodiments of the invention have been described herein for the purpose of illustrating the invention and not for the purpose of limiting the same, it will be appreciated by those of ordinary skill in the art that numerous variations of the details, materials and arrangement of parts may be made within the principle and scope of the invention without departing from the spirit invention. The preceding description, therefore, is not meant to limit the scope of the invention. Rather the scope of the invention is to be determined only by the appended claims and their equivalents.

What is claimed is:

1. An apparatus for generating a muting signal, the apparatus comprising:
   a training mode on/off switch;
   an audio signal detector for remotely receiving an audible ring signal transmitted via an acoustic medium; and
   a processor in communication with the detector, wherein the processor is configured to:
   convert the received audible ring signal into a digitized received audio ring signal;
   in response to a first setting of the training mode on/off switch, store the digitized received audio ring signal in one of a memory device and a storage device associated with the processor as a predetermined digitized audio ring signal;
   in response to a second setting of the training mode on/off switch, compare the digitized received audio ring signal with one or more predetermined digitized audio ring signals, wherein each of the one or more predetermined digitized audio ring signals is associated with a corresponding device and is pre-stored in one of the memory device and the storage device; and
   generate a muting signal based on the comparison when at least a component of the digitized received audio ring signal matches one of the one or more pre-stored predetermined digitized audio ring signals.

2. The apparatus of claim 1, wherein the audio signal detector includes a transducer.

3. The apparatus of claim 1, further including an amplifier in communication with the audio signal detector.

4. The apparatus of claim 1, further including an analog to digital signal converter in communication with the audio signal detector.

5. An apparatus for generating a muting signal, the apparatus comprising;
   means for detecting an audible ring signal transmitted via an acoustic medium;
   means for converting the detected audible ring signal into a digitized detected audio ring signal;
   means for selecting a training mode of the apparatus;
   means for pre-storing one or more predetermined digitized audio ring signals in response to a training mode setting selected by the selecting means, wherein each of the one or more pre-stored predetermined digitized audio ring signals is associated with a corresponding device;
   means for comparing the digitized detected audio ring signal with the one or more pre-stored predetermined digitized audio ring signals in response to a second setting selected by the selecting means; and
   means for generating a muting signal based on the comparison when at least a component of the digitized detected audio ring signal matches one of the one or more pre-stored predetermined digitized audio ring signals.

6. The apparatus of claim 5, further comprising means for amplifying the detected audio signal.

7. An apparatus for generating a muting signal, the apparatus comprising:
   a transducer for remotely detecting an audible ring signal transmitted via an acoustic medium and generating a detected audio ring signal corresponding thereto;
   an amplifier connected to the transducer for amplifying the detected audio ring signal and for generating an amplified detected audio ring signal;
   an analog to digital signal converter connected to the amplifier for converting the amplified detected audio ring signal to a digitized detected audio ring signal;
   a training mode on/off switch;
   one of a memory device and a storage device connected to the converter; and
   a digital signal processor connected to the one of a memory device and a storage device and configured to:
      in response to a first setting of the training mode on/off switch, store the digitized detected audio ring signal in one of a memory device and a storage device associated with the processor as a predetermined digitized audio ring signal;
      in response to a second setting of the training mode on/off switch, compare the digitized detected audio ring signal with one or more predetermined digitized audio ring signals, wherein each of the one or more predetermined digitized audio ring signals is associated with a corresponding device and is pre-stored in the one of a memory device and a storage device; and
      generate a muting signal based on the comparison when at least a component of the digitized detected audio ring signal matches one of the one or more pre-stored predetermined digitized audio ring signals.

8. A method for generating a muting signal, the method comprising:
   detecting an audible ring signal transmitted via an acoustic medium;
   converting the detected audible ring signal into a digitized detected audio ring signal;
   determining whether the detected audible ring signal is for training;
   in response to the detected audible ring signal being for training, pre-storing the detected audible ring signal as one of a plurality of predetermined digitized audio ring signals in one of a memory device and a storage device, wherein each of the one or more pre-stored predetermined digitized audio ring signals is associated with a corresponding device;
   in response to the detected audible ring signal not being for training, comparing the digitized detected audio ring signal with the one or more pre-stored predetermined digitized audio ring signals; and
   generating a muting signal based on the comparison when at least a component of the digitized detected audio ring signal matches one of the one or more pre-stored predetermined digitized audio ring signals.

9. An audio device, comprising:
   a training mode on/off switch;
   an audio signal detector for remotely receiving an audible ring signal transmitted via an acoustic medium; and
   a processor in communication with the detector, wherein the processor is configured to:
      convert the received audible ring signal into a digitized received audio ring signal;
      in response to a first setting of the training mode on/off switch, store the digitized received audio ring signal in one of a memory device and a storage device associated with the processor as a predetermined digitized audio ring signal;
      in response to a second setting of the training mode on/off switch, compare the digitized received audio ring signal with one or more predetermined digitized audio ring signals, wherein each of the one or more predetermined digitized audio ring signals is associated with a corresponding device other than the audio device and is pre-stored in one of the memory device and the storage device; and
      mute the audio device based on the comparison when at least a component of the digitized received audio ring signal matches one of the one or more pre-stored predetermined digitized audio ring signals.

10. The audio device of claim 9, wherein the audio device is selected from the group consisting of a radio, a television, a stereo system, a CD player and a DVD player.

11. The audio device of claim 9, further comprising a muting on/off switch.

12. The audio device of claim 9, further comprising a storage key that is operative to assign a storage location to the digitized received audio ring signal in response to a first setting of the training mode on/off switch.

* * * * *